(12) United States Patent
Kumar et al.

(10) Patent No.: US 12,470,137 B2
(45) Date of Patent: Nov. 11, 2025

(54) NEGATIVE VOLTAGE GENERATOR

(71) Applicant: Infineon Technologies Canada Inc., Ottawa (CA)

(72) Inventors: Ashutosh Kumar, Patna (IN); Abhishek Jain, Delhi (IN); Suraj Somashekara Kumar, Bantwal Taluk (IN); Ramesh G. Karpur, Bangalore (IN); Ashutosh Ravindra Joharapurkar, Bangalore (IN); Zhemin Zhang, Allen, TX (US); Yalong Li, Allen, TX (US); Rohan Samsi, Milpitas, CA (US); Marco A. Zuniga, Berkeley, CA (US)

(73) Assignee: Infineon Technologies Canada Inc., Ottawa (CA)

( * ) Notice: Subject to any disclaimer, the term of this patent is extended or adjusted under 35 U.S.C. 154(b) by 113 days.

(21) Appl. No.: 18/493,640

(22) Filed: Oct. 24, 2023

(65) Prior Publication Data
US 2025/0132668 A1 Apr. 24, 2025

(51) Int. Cl.
*H02M 3/07* (2006.01)
*H03K 3/0231* (2006.01)
*H03K 3/03* (2006.01)

(52) U.S. Cl.
CPC .......... *H02M 3/071* (2021.05); *H03K 3/0231* (2013.01); *H03K 3/03* (2013.01)

(58) Field of Classification Search
CPC ........ H02M 3/071; H03K 3/0231; H03K 3/03
See application file for complete search history.

(56) References Cited

U.S. PATENT DOCUMENTS

| | | | |
|---|---|---|---|
| 6,097,113 A * | 8/2000 | Teraoka | H03K 19/0013 327/544 |
| 6,359,814 B1 | 3/2002 | Sundaram et al. | |
| 2004/0239408 A1 | 12/2004 | Chen et al. | |
| 2016/0211744 A1 | 7/2016 | Arakawa et al. | |
| 2020/0144912 A1 * | 5/2020 | Tokuda | H03K 17/06 |
| 2021/0075309 A1 | 3/2021 | Ikeda | |
| 2024/0097565 A1 * | 3/2024 | Englekirk | H02M 1/08 |
| 2024/0223080 A1 * | 7/2024 | Heo | H02M 1/088 |

OTHER PUBLICATIONS

European Search Report received for application No. / patent No. 24208419.2-1002, Mar. 4, 2025, 10 Pages.

* cited by examiner

*Primary Examiner* — Daniel C Puentes
(74) *Attorney, Agent, or Firm* — WORKMAN NYDEGGER

(57) ABSTRACT

A circuit that is capable of generating a negative voltage on a negative voltage supply node. The circuit includes a negative voltage generation circuit, an oscillator and an oscillator control signal generator. The negative voltage generation circuit generates a negative voltage on the negative voltage supply node in response to receiving a signal from the oscillator. The negative voltage generated by the negative voltage generation circuit depends upon the frequency of the signal from the oscillator. The oscillator control signal generator controls the frequency of the signal from the oscillator by sensing the negative voltage present on the negative voltage supply node, and by increasing or decreasing the frequency of the signal from the oscillator accordingly. Thus, charge is replenished to the negative voltage supply node to more closely match the drawing of charge from that negative voltage supply node, thereby more accurately generating the negative voltage.

17 Claims, 5 Drawing Sheets

NEGATIVE VOLTAGE GENERATOR

BACKGROUND

Electronic circuits are composed of various electronic components such as for example, resistors, capacitors, inductors, diodes, transistors, operational amplifiers, and/or other types of analog or digital electronic components. These components are selected and connected together so that the circuit performs particular functions. For example, circuits have conventionally been used to perform amplification, computation, power transfer, communication, and so forth.

While circuits may be composed of discrete components connected together via wires, some circuit have more recently been structured in an integrated fashion using semiconductor materials and semiconductor processing techniques. Specifically, an integrated circuit may be fabricated by performing semiconductor processing steps to epitaxially growing various semiconductor layers on a substrate (e.g., via chemical vapor deposition, physical vapor deposition, of other epitaxial growth processes). Along with deposition of such layers, the layers are also patterned, for example, via photolithography, etching, and others processes. Through the application of many semiconductor processing techniques, the integrated circuit is effectively grown on the substrate, and is typically a solid-state electronic device. Hence, the circuits so manufactured are called "integrated circuits".

Typically, power is supplied to the integrated circuit via conductive terminals such bond pads, pins, or the like. For example, an integrated circuit typically includes a ground terminal that allows a common ground (also referred to as a Vss) to be available throughout the integrated circuit. Also, a common supply voltage (also referred to as Vdd) is made available throughout the integrated circuit by apply a designed supply voltage to a power supply terminal of the integrated circuit.

However, in some cases, an integrated circuit may include electronic components that are operated using a negative voltage. Accordingly, the integrated circuit may be designed so as to be capable of receiving a negative voltage from an external negative voltage source via one or more external pins. As an example, a negative voltage source outside of the integrated circuit may be generated using an inductor-based inverting voltage converter (e.g., an inverting buck converter, an inverting boost converter, an inverting buck-boost converter, or an inverting Ćuk converter). Alternatively, such a negative voltage source may be generated outside of the integrated circuit via the use of transformers (e.g., using isolated topologies or auxiliary windings).

The subject matter claimed herein is not limited to embodiments that solve any disadvantages or that operate only in environments such as those described above. Rather, this background is only provided to illustrate one example technology area where some embodiments described herein may be practiced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to a circuit that is capable of internally generating a negative voltage on a negative voltage supply node. As a specific example, the negative voltage may be applied to a gate terminal of a field-effect transistor in order to ensure that the field-effect transistor stays off even if the source voltage were to drop below ground.

The circuit includes a negative voltage generation circuit, an oscillator and an oscillator control signal generator. The negative voltage generation circuit generates a negative voltage on the negative voltage supply node in response to receiving an oscillating signal from the oscillator. The negative voltage generated by the negative voltage generation circuit depends upon the frequency of the oscillating signal from the oscillator, and depends upon the load that the negative voltage is being used to drive. The oscillator control signal generator controls the frequency of the oscillating signal from the oscillator by sensing the negative voltage present on the negative voltage supply node, and by setting the frequency of the oscillating signal accordingly.

For example, if the negative voltage is more negative than it should be, and the oscillating signal is at a higher frequency, the frequency may be adjusted to be a lower frequency, thereby an operating frequency of the negative voltage generation circuit may also be decreased. This slower operating frequency allows the negative voltage to be less negative. On the other hand, if the negative voltage is less negative than it should be, and the oscillating signal is at the lower frequency, the frequency may be adjusted to be the higher frequency, thereby an operating frequency of the negative voltage generation circuit may also be increased. This higher operating frequency urges the negative voltage to be more negative.

Accordingly, when charge is quickly drawn from the negative voltage supply node, the oscillator control signal generator may increase the frequency of the oscillator to thereby cause the negative voltage generation circuit to more quickly replenish that charge. On the other hand, when charge is slowly drawn from the negative voltage supply node, the oscillator control signal generator circuit may decrease the frequency of the oscillator to thereby cause the negative voltage generation circuit to more slowly replenish that charge. Either way, the oscillator frequency more closely matches usage of charge on the negative voltage supply node to thereby more accurately control the negative voltage on the negative voltage supply node.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the advantages and features of the principles described herein can be obtained, a more particular description of the embodiments briefly described above will be rendered by reference to specific embodiments thereof which are illustrated in the appended drawings. Understanding that these drawings depict only typical embodiments of the principles described herein, and are not therefore to be considered to be limiting of their scope, certain embodiments will be described and explained with additional specificity and detail through the use of the accompanying drawings in which.

DETAILED DESCRIPTION

Embodiments described herein relate to a circuit that is capable of internally generating a negative voltage on a negative voltage supply node. As a specific example, the negative voltage may be applied to a gate terminal of a field-effect transistor in order to ensure that the field-effect transistor stays off even if the source voltage were to drop below ground.

The circuit includes a negative voltage generation circuit, an oscillator and an oscillator control signal generator. The negative voltage generation circuit generates a negative voltage on the negative voltage supply node in response to receiving an oscillating signal from the oscillator. The negative voltage generated by the negative voltage generation circuit depends upon the frequency of the oscillating signal from the oscillator, and depends upon the load that the negative voltage is being used to drive. The oscillator control signal generator controls the frequency of the oscillating signal from the oscillator by sensing the negative voltage present on the negative voltage supply node, and by setting the frequency of the oscillating signal accordingly.

For example, if the negative voltage is more negative than it should be, and the oscillating signal is at a higher frequency, the frequency may be adjusted to be a lower frequency, thereby an operating frequency of the negative voltage generation circuit may also be decreased. This slower operating frequency allows the negative voltage to be less negative. On the other hand, if the negative voltage is less negative than it should be, and the oscillating signal is at the lower frequency, the frequency may be adjusted to be the higher frequency, thereby an operating frequency of the negative voltage generation circuit may also be increased. This higher operating frequency urges the negative voltage to be more negative.

Accordingly, when charge is quickly drawn from the negative voltage supply node, the oscillator control signal generator may increase the frequency of the oscillator to thereby cause the negative voltage generation circuit to more quickly replenish that charge. On the other hand, when charge is slowly drawn from the negative voltage supply node, the oscillator control signal generator circuit may decrease the frequency of the oscillator to thereby cause the negative voltage generation circuit to more slowly replenish that charge. Either way, the oscillator frequency more closely matches usage of charge on the negative voltage supply node to thereby more accurately control the negative voltage on the negative voltage supply node.

Figure 1:
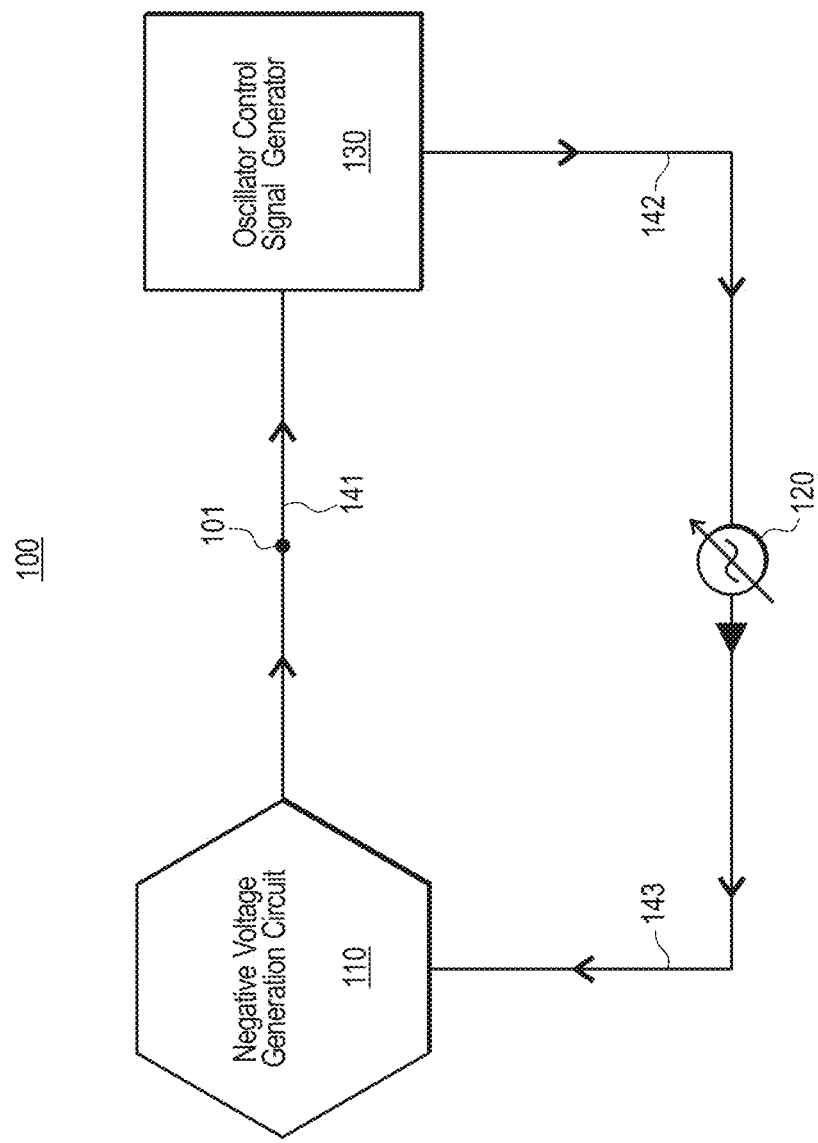
FIG. 1 illustrates a circuit in which the principles described herein may be practiced, and is just one example of a circuit that is consistent with the principles described herein.

FIG. 1 illustrates a circuit 100 in which the principles described herein may be practiced, and is just one example of a circuit that is consistent with the principles described herein. The circuit 100 is structured to supply a negative voltage to a negative voltage supply node 101. The negative voltage on the negative voltage supply node 101 may be used to provide power to components such as, for example, a field-effect transistor (not shown). However, the principles described herein are not limited to the types of components that receive power from the negative voltage supply node 101, or the reasons for generation of the negative voltage on the negative voltage supply node 101.

The circuit 100 includes a negative voltage generation circuit 110, an oscillator 120, and an oscillator control signal generator 130. The negative voltage generation circuit 110 generates a negative voltage on the negative voltage supply node 101 in response to receiving an oscillating signal from the oscillator 120. The oscillating signal may be a sinusoidal signal having a particular frequency. Alternatively, the oscillating signal may be another alternating signal (e.g., a square wave) having a fundamental frequency. In either case, the signal will be referred to as an "oscillating signal" and the "frequency" of the oscillating signal refers to the fundamental frequency of the oscillating signal.

The negative voltage generated by the negative voltage generation circuit 110 depends upon the frequency of the oscillating signal from the oscillator 120 (though the negative voltage may depend on other factors as well such as a rate of usage of charge on the negative voltage supply node 101). The oscillator control signal generator 130 controls the frequency of the oscillating signal from the oscillator 120 by sensing the negative voltage present on the negative voltage supply node 101, and by setting the frequency of the oscillating signal accordingly. This process of controlling the frequency of the oscillating signal depending on the negative voltage present on the negative voltage supply node 101 may occur continuously, such that the oscillator control signal generator 130 continuously senses the negative voltage and continuously sets the frequency of the oscillating signal accordingly. Alternatively, this process may occur less continually, such that the oscillator control signal generator 130 only periodically samples the negative voltage supply node 101, and then periodically sets the frequency of the oscillating signal accordingly.

In FIG. 1, arrowed line 141 represents the negative voltage generation circuit 110 generating the negative voltage on the negative voltage supply node 101, and represents the oscillator control signal generator 130 sensing the negative voltage on the negative voltage supply node 101. Further, arrowed line 142 represents the oscillator control signal generator 130 outputting an oscillator control signal to the oscillator 120, thereby setting the frequency of the oscillating signal from the oscillator 120. Finally, arrowed line 143 represents the oscillator 120 outputting the oscillating signal having a particular frequency to the negative voltage generation circuit 110, thereby causing the negative voltage generation circuit 110 to output the negative voltage to the negative voltage supply node 101.

As an example, suppose that the function of the circuit 100 is to ideally generate a particular negative voltage (also referred to herein as a "specified negative voltage") on the negative voltage supply node 101. Suppose also that the presence of voltages less negative than the specified negative voltage would indicate that a higher frequency of the oscillating signal is warranted, and that the presence of voltages that are more negative than the specified negative voltage would indicate that a lower frequency of the oscillating signal is warranted. In this case, if the oscillator control signal generator 130 senses that the negative voltage on the negative voltage supply node 101 is less negative than the specified negative voltage, the oscillator control signal generator 130 may ensure that the oscillating signal from the oscillator 120 is at the higher frequency. Thus, the operating frequency of the negative voltage generation circuit 110 is also high, which urges the negative voltage on the negative voltage supply node 101 to be more negative (since negative charge is being provided on the negative voltage supply node 101 faster than the negative charge is being drawn by a load). In a case in which the negative voltage generation circuit 110 is a charge pump, this may occur by increasing the rate at which negative charge is pumped onto the negative voltage supply node 101.

As a specific example, if the specified negative voltage was negative 3 volts, and the oscillator control signal generator 130 sensed that the negative voltage on the negative voltage supply node 101 was only negative 2.6 volts, the oscillator control signal generator 130 would ensure the frequency of the oscillating signal from the oscillator 120 is at the higher frequency. Accordingly, the operating frequency of the negative voltage generation circuit 110 would also be at the higher frequency, thereby urging the negative voltage on the negative voltage supply node 101 to be closer to negative 3 volts.

The negative voltage sensed on the negative voltage supply node 101 may be less negative than the specified negative voltage if, for example, the circuit 100 had just been powered on and the negative voltage generation circuit 110 had not yet had the time to fully decrease the negative voltage on the negative voltage supply node 101 to approximately the specified negative voltage. Alternatively, this may occur if, for example, a load coupled to the negative voltage supply node 101 was drawing a large amount of negative charge from the negative voltage supply node 101, thus quickly depleting negative charge from the negative voltage supply node 101.

If the oscillator control signal generator 130 senses that the negative voltage on the negative voltage supply node 101 is more negative than the specified negative voltage, the oscillator control signal generator 130 may ensure that the oscillating signal from the oscillator 120 is at the lower frequency. Thus, the operating frequency of the negative voltage generation circuit 110 is also low, which thus allows the negative voltage on the negative voltage supply node 101 to be less negative (since negative charge is being provided on the negative voltage supply node 101 slower than the negative charge is being drawn by a load). In a case in which the negative voltage generation circuit 110 is a charge pump, this may occur by decreasing the rate at which negative charge is pumped onto the negative voltage supply node 101.

The negative voltage sensed on the negative voltage supply node 101 may be below the specified negative voltage if, for example, the negative voltage generation circuit 110 had already had the time to previously decrease the negative voltage on the negative voltage supply node 101 to be more negative than the specified negative voltage, and the load coupled to the negative voltage supply node 101 was not drawing a large amount of negative charge from the negative voltage supply node 101. For context, reducing the operating frequency of the negative voltage generation circuit 110, when acceptable, allows the negative voltage generation circuit 110 to have reduced power consumption and heat losses.

Accordingly, in the embodiment in which the function of the circuit 100 is to ideally generate the specified negative voltage, the circuit 100 is capable of accurately generating a negative voltage on a negative voltage supply node 101 by automatically adjusting the operating frequency of the negative voltage generation circuit 110. However, in other embodiments, the specified negative voltage to be generated by the circuit 100 may change dynamically over time. For instance, perhaps the circuit 100 is to generate a square wave that alternates between negative 2 volts and negative 1 volt. In this case, the circuit 100 may still operate to target that dynamically changing specified negative voltage by comparing the actual negative voltage on the negative voltage supply node 101 with whatever specified negative voltage should be present on the negative voltage supply node 101 at any given time.

Further, frequent automatic operating frequency adjustments allows the circuit 100 to 1) quickly decrease the negative voltage on the negative voltage supply node 101 to approximately the specified negative voltage when the circuit 100 is first powered on, 2) quickly decrease the negative voltage on the negative voltage supply node 101 to approximately the specified negative voltage when a load is drawing a large amount of charge from the negative voltage supply node 101, and 3) reduce power losses by decreasing the frequency of the signal from the oscillator 120 when the negative voltage generation circuit 110 has already sufficiently decreased the negative voltage on the negative voltage supply node 101.

Generating the negative voltage internally (e.g., on an integrated circuit chip, such as the circuit 100) on the negative voltage supply node 101 prevents the need for providing an external negative voltage supply. Accordingly, because no external negative voltage supply needs to be provided or generated, any device that contains the circuit 100 may be constructed more compactly and inexpensively. This is because generating a negative voltage supply externally may require relatively large and expensive components, such as transformers or isolated power converters.

As previously expressed, the principles described herein are not limited to the types of components that receive power from the negative voltage supply node 101, or the reasons for generation of the negative voltage on the negative voltage supply node 101. However, in one embodiment, the negative voltage is provided to a gate terminal of a field-effect transistor in order to ensure that the field-effect transistor stays off. To explain why this might be helpful, a brief explanation of field-effect transistors will now be described.

A field-effect transistor has a gate terminal on which a control voltage may be applied (e.g., via a gate driver) in order to control whether current flows between a drain terminal and a source terminal of the field-effect transistor. To turn on the field-effect transistor, a control voltage may be applied to the gate terminal that is high enough so as to cause the gate-to-source voltage of the field-effect transistor to be above a threshold voltage. To turn off the field-effect transistor, a control voltage may be applied to the gate terminal that is low enough so as to cause the gate-to-source voltage of the field-effect transistor to be below the threshold voltage. As an example, in many cases, a field-effect transistor may be turned off by applying zero volts to the gate terminal of the field-effect transistor, while the source voltage is grounded. Thus, in that case, the gate-to-source voltage is zero.

A gate driver may be used to control the control voltage on the gate terminal of the field-effect transistor. Phenomena such as miller coupling, parasitic induction between the field-effect transistor and the gate driver, or any other trace inductances that may be present in a device that contains the circuit 100, may cause a brief residual peak in gate-to-source voltage after the field-effect transistor has been turned off (e.g., by applying zero volts to the gate terminal of the field-effect transistor). This peak is referred to as a "residual" peak because it is undesirably present after the field-effect transistor has been turned off. The brief residual peak in gate-to-source voltage may be higher than the aforementioned threshold voltage of the field-effect transistor, and thus may cause unintended turn-on of the field-effect transistor. This may cause severe damage to the field-effect transistor, and/or to any circuit containing or coupled to the field-effect transistor.

Accordingly, in order to ensure that any brief residual peak in gate-to-source voltage of the field-effect transistor does not exceed the threshold voltage of the field-effect transistor after the field-effect transistor has been turned off, the field-effect transistor may instead be turned off by applying a negative voltage to the gate terminal of the field-effect transistor. While there is still a residual peak in this case, the negative voltage applied to the gate terminal ensures that the gate-to-source voltage does not increase to above the threshold voltage. Thus, even during the residual peak, the field-effect transistor stays off. The negative voltage that is applied to the gate terminal may be generated using the circuit 100 of FIG. 1, as a mere example.

Figure 2:
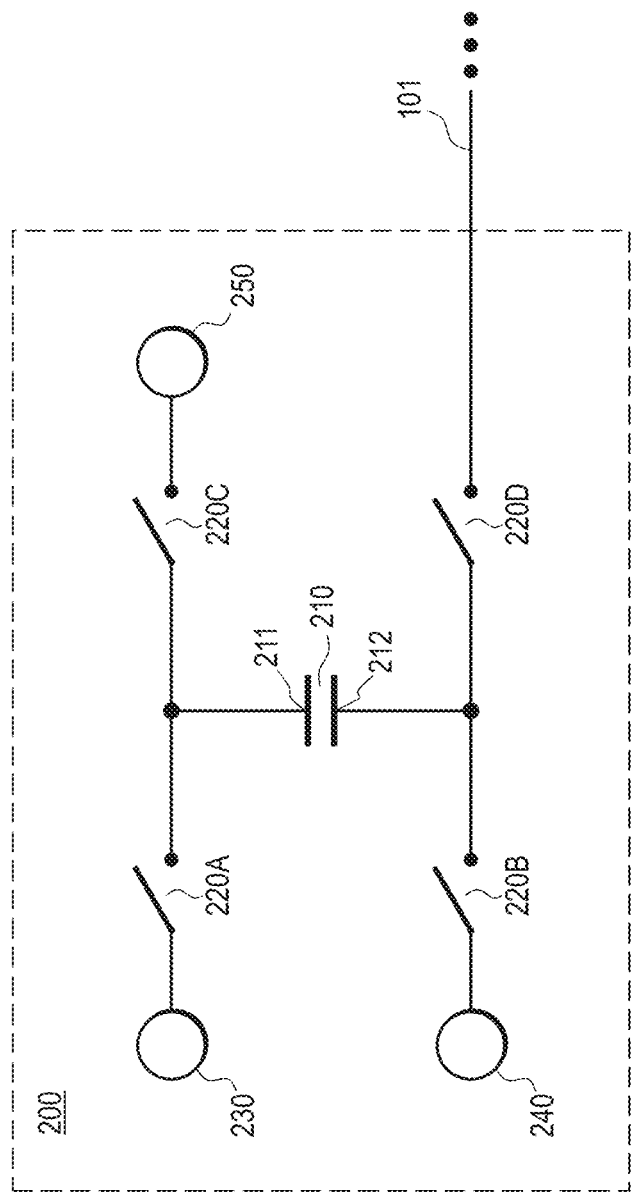
FIG. 2 illustrates a charge pump, which is an example of the negative voltage generation circuit of FIG. 1.

FIG. 2 illustrates a charge pump 200, which is an example of the negative voltage generation circuit 110 of FIG. 1. The charge pump 200 includes a charging capacitor 210, four switches 220A through 220D, and three input voltage sources 230, 240 and 250. The charging capacitor 210 has a first capacitor terminal 211 and a second capacitor terminal 212. The first switch 220A is connected between the first capacitor terminal 211 and the first input voltage source 230. The second switch 220B is connected between the second capacitor terminal 212 and the second input voltage source 240. The third switch 220C is connected between the first capacitor terminal 211 and the third input voltage source 250. Finally, the fourth switch 220D is connected between the second capacitor terminal 212 and, for example, the negative voltage supply node 101 of FIG. 1. In one embodiment, the first input voltage source 230 provides a positive voltage (e.g., positive 3 volts), whereas the second input voltage source 240 and the third input voltage source 250 each provide ground.

In operation, the charge pump 200 pumps charge to the negative voltage supply node 101 during each repetition of a charge pump cycle. During a first phase of the charge pump cycle, the first switch 220A and the second switch 220B are closed while the third switch 220C and the fourth switch 220D are open. During this first phase, the charging capacitor 210 is charged to the voltage difference between the first input voltage source 230 and the second input voltage source 240. As an example, when the first input voltage source 230 provides positive 3 volts, and the second input voltage source 240 provides ground, the charging capacitor 210 would be charged such that a voltage difference of 3 volts exists between its first capacitor terminal 211 and its second capacitor terminal 212. In this case, the voltage at the first capacitor terminal 211 would be at positive 3 volts, and the voltage at the second capacitor terminal 212 would be at ground.

During a second phase of the charge pump cycle, the third switch 220C and the fourth switch 220D are closed while the first switch 220A and the second switch 220B are open. During this second phase, the charging capacitor 210 maintains the voltage difference between the first capacitor terminal 211 and the second capacitor terminal 212. However, given that the third input voltage source 250 provides ground, the voltage at the first capacitor terminal 211 would be at ground, and the voltage at the second capacitor terminal 212 would now be at negative 3 volts. Accordingly, since during the second phase of the charge pump cycle, the negative voltage supply node 101 is coupled to the second capacitor terminal 212 via the switch 220D, negative charge is provided from the charging capacitor 210 to the negative voltage supply node 101. Because negative charge would then flow from the second capacitor terminal 212, the voltage at the second capacitor terminal 212 would thereafter rise. However, negative charge has indeed been pumped to the negative voltage supply node 101.

In one embodiment, the charging capacitor 210 is a relatively small capacitor (e.g., 100 picofarads) so as to be able to fit easily on an integrated circuit. However, charge on the negative voltage supply node 101 may be stored on an external capacitor that is many times the size of the charging capacitor 210. For example, while the charging capacitor 210 may have a capacitance of 100 pico-farads, the external capacitor may have a capacitance of 50 nano-farads (500 times larger than the charging capacitor 210). Thus, in order for the charge pump 200 to sufficiently provide negative charge to the negative voltage supply node 101, the charge pump 200 would repeat the charge pump cycle with a high frequency. Accordingly, while the charge pump 200 repeats the charge pump cycle with a high frequency, the negative voltage supply node 101 is provided with sufficient negative charge and the negative voltage is decreased to approximately negative 3 volts. The charge pump 200 includes transistors and a small capacitor, and uses voltage sources that may be widely available in an integrated circuit (e.g., by being externally applied). Thus, the negative voltage generation circuit 110 (if embodied as the charge pump 200) may more easily be implemented within an integrated circuit.

Figure 3:
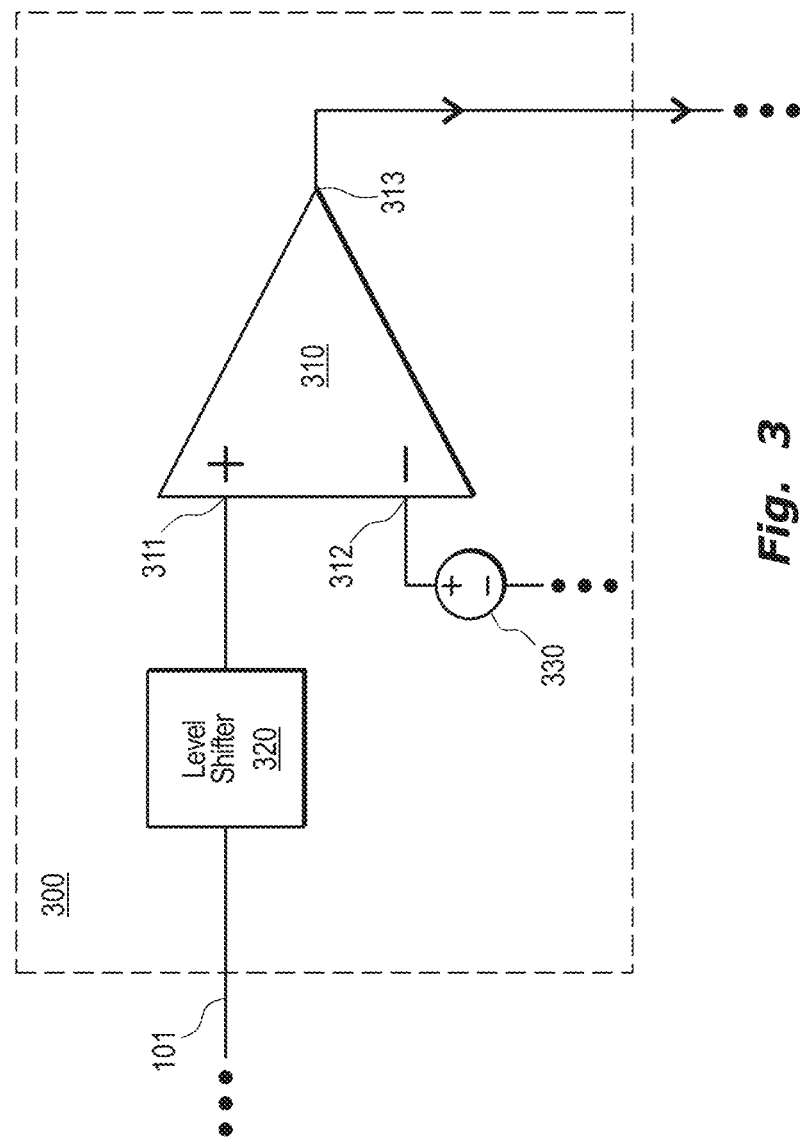
FIG. 3 illustrates an oscillator control signal generator, which is an example of the oscillator control signal generator of FIG. 1.

FIG. 3 illustrates an oscillator control signal generator 300, which is an example of the oscillator control signal generator 130 of FIG. 1. The oscillator control signal generator 300 includes a comparator 310, a level shifter 320 and a reference voltage source 330. The comparator 310 has a positive comparator input node 311 connected to the level shifter 320, a negative comparator input node 312 connected to the reference voltage source 330, and a comparator output node 313 connected to, for example, the oscillator 120 of FIG. 1.

The positive comparator input node 311 is coupled to, for example, the negative voltage supply node 101 via the level shifter 320. The level shifter 320 takes the negative voltage from the negative voltage supply node 101 as an input, and outputs a shifted voltage that depends on the negative voltage to the positive comparator input node 311. The comparator 310 compares the shifted voltage on the positive comparator input node 311 against a reference voltage on the negative comparator input node 312 provided by the reference voltage source 330, and outputs an oscillator control signal to the comparator output node 313.

Using the level shifter 320 allows the comparator 310 to compare two different positive voltages, instead of directly comparing the negative voltage on the negative voltage supply node 101 against some other negative voltage provided by a negative reference voltage source. This allows the oscillator control signal generator 300 (or any circuit containing the oscillator control signal generator 300) to be more compact, not needing additional components necessary for providing a negative reference voltage to the negative comparator input node 312.

The reference voltage source 330 may provide a fixed voltage, in the case in which the specified negative voltage is a fixed negative voltage. This fixed reference voltage may be, for example, programmable either through an internal memory or via manual instruction from a user. Likewise, the specified negative voltage may be, for example, programmable either through an internal memory or via manual instruction from a user. However, as previously mentioned, the specified negative voltage may dynamically change over time. To facilitate this, the reference voltage source 330 may provide a variable reference voltage that tracks the desired changes in the specified negative voltage. Accordingly, the reference voltage may be a dynamic voltage that changes according to, for example, dynamic changes in the specified negative voltage. Alternatively, the level shifter 320 may be a variable level shifter that varies the amount that the shifted voltage is shifted so as to track the desired changes in the specified negative voltage.

To give an example of the operation of the oscillator control signal generator 300, suppose that the reference voltage source 330 provides a constant reference voltage of positive 1 volt, that the level shifter 320 outputs a shifted voltage that is 4 volts higher than the negative voltage on the negative voltage supply node 101, and that the specified negative voltage to be generated on the negative voltage supply node 101 is negative 3 volts. Suppose further that if the negative voltage is more negative than the specified negative voltage, then then frequency of the oscillating signal and the operating frequency of the negative voltage generation circuit 100 should be at a high frequency. On the hand, suppose further that if the negative voltage is less negative than the specified negative voltage, then then frequency of the oscillating signal and the operating frequency of the negative voltage generation circuit 100 should be at a low frequency.

In this case, in the event that the negative voltage on the negative voltage supply node 101 had not been decreased to the specified negative voltage, the comparator 310 would output a high signal as the oscillator control signal, indicating that the oscillator should ensure the frequency of the oscillating signal is high. Thus, as an example, if the negative voltage on the negative voltage supply node 101 was only decreased to negative 2 volts, the level shifter 320 would output a shifted voltage of positive 2 volts. Since the positive shifted voltage of 2 volts on the positive comparator input node 311 is higher than the reference voltage of 1 volt on the negative comparator input node 312, the comparator 310 would output a high signal as the oscillator control signal, indicating that the oscillator should ensure the frequency of the oscillating signal is high.

On the other hand, when the negative voltage on the negative voltage supply node 101 has been decreased to be more negative more than the specified negative voltage, the comparator 310 would output a low signal as the oscillator control signal, indicating that the oscillator should ensure the frequency of the oscillating signal is low. Thus, in the example, once the negative voltage on the negative voltage supply node 101 has been decreased to more negative than negative 3 volts, the level shifter 320 would output a shifted voltage that is less than positive 1 volt. When the shifted voltage on the positive comparator input node 311 is less than the reference voltage of 1 volt on the negative comparator input node 312, the comparator 310 would output a low signal as the oscillator control signal, indicating that the oscillator should ensure the frequency of the oscillating signal is low.

In some embodiments, other components may be added, or alterations may be made to the oscillator control signal generator 300, so as to add additional levels of control regarding the output oscillator control signal. For example, in one embodiment, instead of a digital comparator (e.g., the comparator 310 of FIG. 3), the oscillator control signal generator may include an operational amplifier functioning as an analog comparator. This could be accomplished, for example, by configuring the operational amplifier to be operated in an open loop mode, or by configuring the operational amplifier to be operated using positive feedback or negative feedback.

The operational amplifier may have an operational amplifier positive input node coupled to, for example, the negative voltage supply node. In one embodiment, the operational amplifier positive input node may be coupled to the negative voltage supply node via a level shifter that outputs a shifted voltage that depends on the negative voltage on the negative voltage supply node. The operational amplifier may further include an operational amplifier negative input node connected to a reference voltage source (possibly provided by negative feedback), and an operational amplifier output node connected to, for example, the oscillator 120. As an example, in operation, when the shifted voltage is higher than the reference voltage, the operational amplifier causes the frequency of the oscillating signal generated by the oscillator 120 to be higher than when the shifted voltage is lower than the reference voltage.

While a digital comparator (e.g., the comparator 310) would have the advantage of quickly reacting to changes in the negative voltage on the negative voltage supply node due to the nature of digital comparators, some digital comparators may also only have two output options (e.g., a high signal or a low signal). On the other hand, an operational amplifier functioning as a type of analog comparator would have the advantage of being capable of continually changing output signals based on the negative voltage on the negative voltage supply node. However, operational amplifiers operating as analog comparators may not have the same quick reaction times as digital comparators. To achieve a balance of quick reaction time and variability in output signal options, a digital multi-level comparator may instead be used in the oscillator control signal generator, as is the case in FIG. 5 (described later). However, the oscillator control signal generator 300 is only one example of the oscillator control signal generator 130 of FIG. 1, and thus the principles described herein are not limited to any specific structure of the oscillator control signal generator 300.

Figure 4:
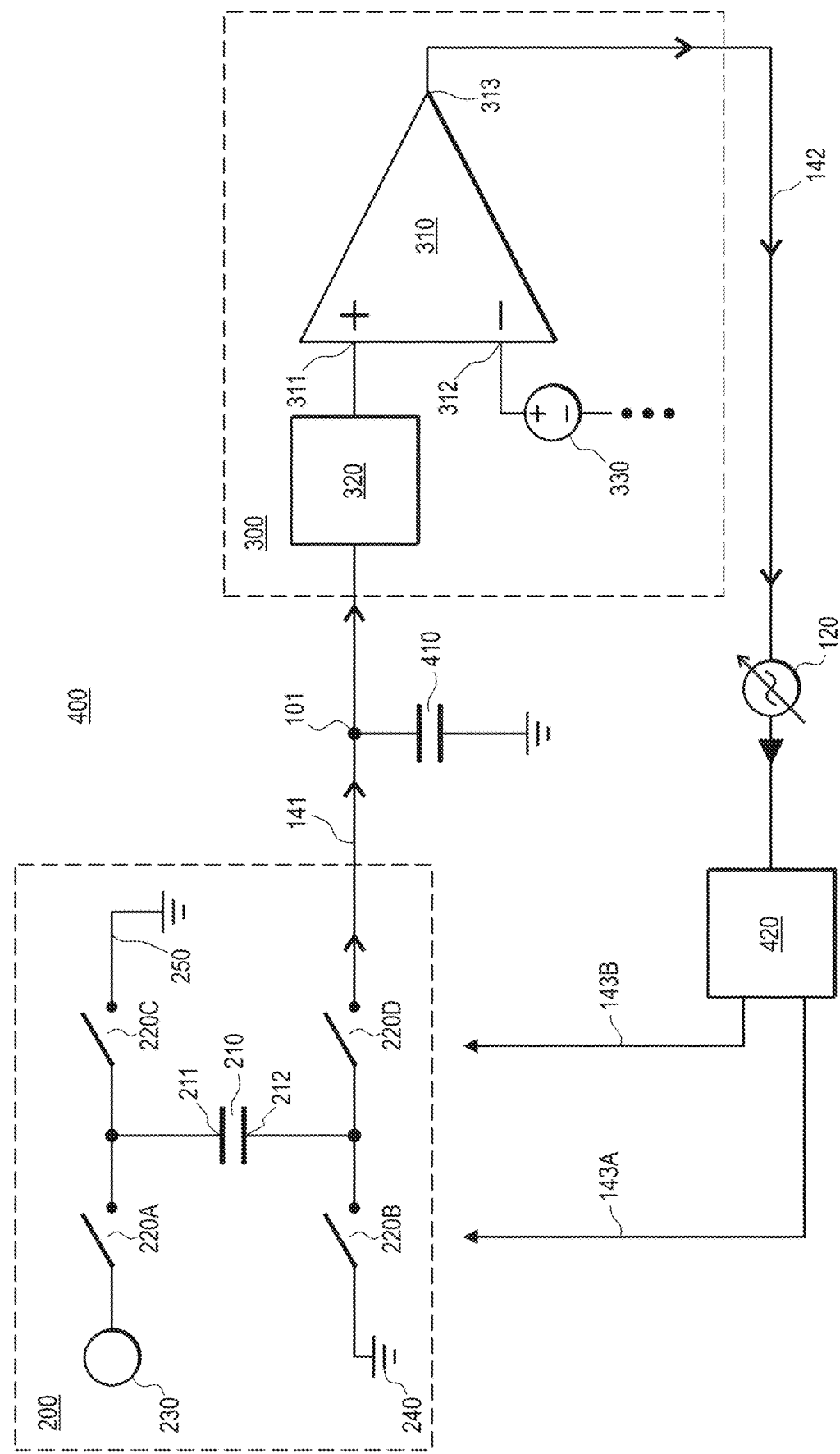
FIG. 4 illustrates a circuit, which is an example of the circuit of FIG. 1.

FIG. 4 illustrates a circuit 400, which is an example of the circuit 100 of FIG. 1. Specifically, the circuit 400 includes an instance of the charge pump 200 of FIG. 2, the oscillator 120 of FIG. 1, and an instance of the oscillator control signal generator 300 of FIG. 3, as respective examples of the negative voltage generation circuit 110, the oscillator 120, and the oscillator control signal generator 130 of FIG. 1. The circuit 400 further includes an external capacitor 410 and a non-overlap component 420.

Similar to FIG. 1, arrowed line 141 represents the charge pump 200 generating the negative voltage on the negative voltage supply node 101, and represents the oscillator control signal generator 300 sensing the negative voltage on the negative voltage supply node 101 (via the level shifter 320). Further, arrowed line 142 represents the oscillator control signal generator 300 outputting an oscillator control signal to the oscillator 120, thereby causing the frequency of the oscillating signal from the oscillator 120 to increase or decrease. Finally, arrowed lines 143A and 143B represent the oscillator 120 outputting an oscillating signal having a particular frequency (via the non-overlap component 420) to the switches 220A through 220D of the charge pump 200, thereby causing the charge pump 200 to output the negative voltage (that depends on the frequency of the oscillating signal from the oscillator 120) to the negative voltage supply node 101. The non-overlapping component 420 ensures that not all four switches 220A, 220B, 220C and 220D are closed at the same time, thereby preventing a surge in current.

Again, for purposes of explanation, suppose that the specified negative voltage to be generated on the negative voltage supply node 101 is negative 3 volts, that the reference voltage source 330 provides a reference voltage of positive 1 volt, and that the level shifter 320 outputs a shifted voltage that is 4 volts higher than the negative voltage on the negative voltage supply node 101.

In operation, when the circuit 400 is first powered on, the voltage on the negative voltage supply node 101 would be at approximately zero volts. As the charge pump 200 begins to provide negative charge to the negative voltage supply node 101, that negative charge is stored on the external capacitor 410. While this external capacitor 410 is illustrated in FIG. 4, the external capacitor 410 may actually exist outside of the circuit 400 of FIG. 4, hence the term "external capacitor". Recall that the external capacitor 410 may be many times larger (e.g., 500 times larger) than the charging capacitor 210, and therefore the charge pump 200 may operate with a high frequency in order to provide sufficient negative charge to the negative voltage supply node 101 and to sufficiently decrease the negative voltage on the negative voltage supply node 101 to approximately the specified negative voltage.

As the charge pump 200 begins to decrease the negative voltage closer to the specified negative voltage (i.e., the negative voltage is higher than negative 3 volts), the level shifter 320 would output a shifted voltage that is higher than the reference voltage of 1 volt. In this case, the comparator 310 would output a high signal, indicating to ensure a high frequency of the oscillating signal provided by the oscillator 120, and thereby ensure that the charge pump 200 quickly provides negative charge to the negative voltage supply node 101. Accordingly, the circuit 400 is capable of increasing the frequency with which the charge pump 200 provides negative charge to the negative voltage supply node 101, thus allowing the negative voltage on the negative voltage supply node 101 to be quickly decreased to the specified negative voltage when the circuit 400 is first powered on.

Once the charge pump 200 has successfully decreased the negative voltage to below the specified negative voltage (e.g., negative 3 volts), the level shifter 320 would output a shifted voltage that is less than the reference voltage of 1 volt. In this case, the comparator 310 would output a low signal, indicating to ensure a low frequency of the oscillating signal provided by the oscillator 120, and thereby ensure that the charge pump 200 more slowly provides negative charge to the negative voltage supply node 101. Accordingly, the circuit 400 is capable of reducing power losses in the charge pump 200 by decreasing the frequency with which the charge pump 200 provides negative charge to the negative voltage supply node 101 when the charge pump 200 has already sufficiently decreased the negative voltage on the negative voltage supply node 101 to approximately the specified negative voltage.

When a load (e.g., a gate terminal of a field-effect transistor) coupled to the negative voltage supply node 101 draws a large amount of charge from the negative voltage supply node 101, the negative voltage on the negative voltage supply node 101 may begin to be pulled up away from the specified negative voltage. Thus, the level shifter 320 would output a shifted voltage that is higher than the reference voltage of 1 volt. In this case, the comparator 310 would again output a high signal, ensuring that the charge pump 200 quickly replenishes negative charge to the negative voltage supply node 101. Accordingly, the circuit 400 is capable of increasing the frequency with which the charge pump 200 replenishes charge to the negative voltage supply node 101 while a large amount of charge is being drawn from the negative voltage supply node 101 by a load.

Figure 5:
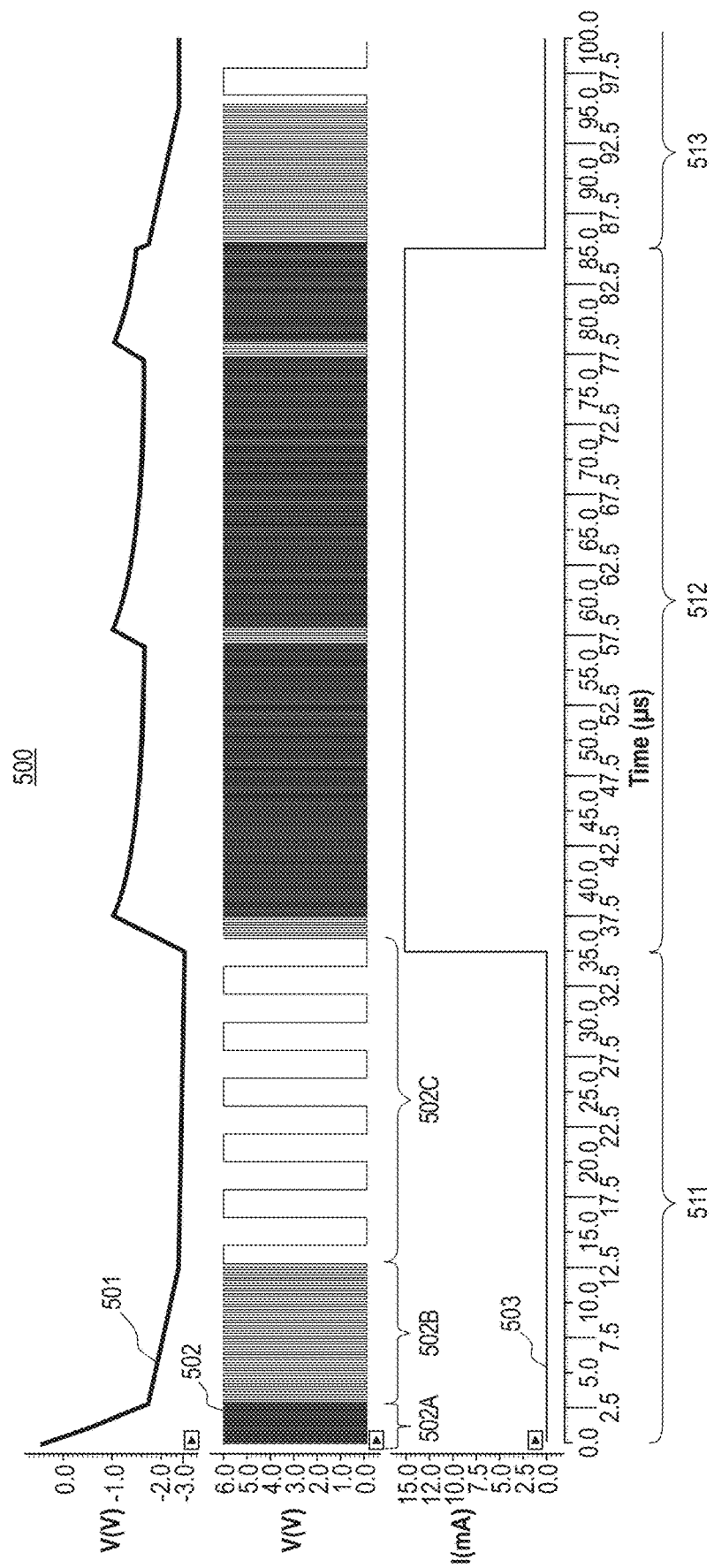
FIG. 5 illustrates a signal diagrams chart, which shows an example of signals generated by the operation of the circuit of FIG. 4.

FIG. 5 illustrates a signal diagrams chart 500, which shows an example of signals generated by the operation of the circuit 400 of FIG. 4. Three signals 501, 502 and 503 are illustrated, which are provided merely by way of example. The horizontal axis represents time passing from left to right, where the same horizontal position in each of the three signals 501, 502 and 503 represents the same time. The vertical axis for each respective signals 501, 502 and 503 represents the amplitude of the respective signal. The time is divided into three general time periods 511, 512 and 513.

Signal 501 represents the negative voltage (in volts) generated on the negative voltage supply node 101. Signal 502 represents the oscillating signal from the oscillator 120, where the oscillating signal from the oscillator 120 oscillates between a high voltage (e.g., positive 6 volts) and a low voltage (e.g., zero volts). As an example, at the rising edge of the oscillating signal from the oscillator 120, the charge pump 200 may begin to operate in the first phase of the charge pump cycle, whereas at the falling edge of the oscillating signal from the oscillator 120, the charge pump 200 may begin to operate in the second phase of the charge pump cycle, or vice versa. Further, in FIG. 5, the signal from the oscillator 120 is shown to oscillate at three different frequencies. As previously expressed, this may be the case when using a digital multi-level comparator that has, for example, three different output options, to enable three different oscillating frequencies of the oscillating signal generated by the oscillator 120. Finally, signal 503 represents the current (in milliamps) drawn by a load coupled to the negative voltage supply node 101.

In time period 511, the circuit 400 may be in a start-up phase. For example, at the beginning of the time period 511, the circuit 400 may have just been powered on. During this time period 511, the load is not drawing (or at least drawing only a minimal amount of) negative charge from the negative voltage supply node 101 (see signal 503 in time period 511). At the very beginning of time period 511, the negative voltage (signal 501) on the negative voltage supply node 101 is shown to be at (or above) approximately zero volts. In this case, the oscillator control signal generator 300 would cause the oscillating signal from the oscillator 120 to operate at a high frequency, as shown in subsection 502A of the signal 502. In fact, the oscillating signal 502 in subsection 502A is oscillating so fast that the signal 502 appears solid in FIG. 5, due to the resolution of the diagram.

Once the charge pump 200 has decreased the negative voltage on the negative voltage supply node 101 to some intermediate negative voltage (e.g., approximately negative 1.8 volts in signal 501), the oscillator control signal generator 300 may cause the oscillating signal from the oscillator 120 to operate at a medium frequency, as shown in subsection 502B of the signal 502. When the charge pump 200 has successfully decreased the negative voltage on the negative voltage supply node 101 to approximately the specified negative voltage (e.g., negative 3 volts), the oscillator control signal generator 300 may cause the oscillating signal from the oscillator 120 to be at a low frequency, as shown in subsection 502C of the signal 502.

In time period 512, the load begins drawing a large amount of negative charge from the negative voltage supply node 101. During this time, the oscillator control signal generator 300 alternates between causing the signal from the oscillator 120 to operate at a high frequency and to operate at a medium frequency as the charge pump 200 attempts to replenish the charge drawn by the load. While the timeline 501 shows that, during time period 512, the negative voltage on the negative voltage supply node 101 may not be completely decreased to the specified negative voltage (e.g., negative 3 volts), decreasing the negative voltage on the negative voltage supply node 101 even partially has the benefit of reducing the chance of unintended turn-on of a field-effect transistor.

In time period 513, the load returns to not drawing a large amount of negative charge from the negative voltage supply node 101. During this time, the oscillator control signal generator 300 causes the signal from the oscillator 120 to operate at a medium frequency, and then to operate at a low frequency as the charge pump 200 is able to sufficiently replenish charge to the negative voltage supply node 101.

Accordingly, the circuit 400 is capable of accurately generating a negative voltage on a negative voltage supply node 101 by automatically adjusting the operating frequency of the charge pump 200. Further, frequent automatic operating frequency adjustments allows the circuit 100 to 1) quickly decrease the negative voltage on the negative voltage supply node 101 to approximately the specified negative voltage when the circuit 400 is first powered on, 2) quickly decrease the negative voltage on the negative voltage supply node 101 to approximately the specified negative voltage when a load is drawing a large amount of charge from the negative voltage supply node 101, and 3) reduce power losses by decreasing the frequency of the signal from the oscillator 120 when the charge pump 200 has already sufficiently decreased the negative voltage on the negative voltage supply node 101.

Literal Support Section

Clause 1. A circuit configured to generate a negative voltage on a negative voltage supply node, the circuit comprising: an oscillator; a negative voltage generation circuit configured to respond to receiving a signal from the oscillator by generating a negative voltage on the negative voltage supply node, wherein the negative voltage is a function of a frequency of the signal received from the oscillator; and an oscillator control signal generator configured to sense the negative voltage present on the negative voltage supply node, and in response to the sensing, control the frequency of the signal generated by the oscillator.

Clause 2. The circuit according to Clause 1, wherein the negative voltage generation circuit operates at an operating frequency that depends on the frequency of the signal generated by the oscillator.

Clause 3. The circuit according to Clause 2, the negative voltage generation circuit comprising a charge pump, the charge pump comprising: a charging capacitor having a first capacitor terminal and a second capacitor terminal; a first switch connected between a first input voltage source and the first capacitor terminal; a second switch connected between a second input voltage source and the second capacitor terminal; a third switch connected between the first capacitor terminal and a third input voltage source; and a fourth switch connected between the second capacitor terminal and the negative voltage supply node.

Clause 4. The circuit according to Clause 3, wherein the first input voltage source provides a positive voltage, the second input voltage source provides ground, and the third input voltage source provides ground.

Clause 5. The circuit according to Clause 3, wherein during a first phase of a charge pump cycle, the first switch and the second switch are closed while the third switch and the fourth switch are open, thereby providing charge to the charging capacitor, and during a second phase of the charge pump cycle, the third switch and the fourth switch are closed while the first switch and the second switch are open, thereby providing charge from the charging capacitor to the negative voltage supply node.

Clause 6. The circuit according to Clause 5, the circuit further comprising a non-overlap component configured to prevent the first switch and the second switch from being closed while the third switch and the fourth switch are closed, and configured to prevent the third switch and the fourth switch from being closed while the first switch and the second switch are closed.

Clause 7. The circuit according to Clause 5, wherein charge on the negative voltage supply node is stored on an external capacitor.

Clause 8. The circuit according to Clause 2, the oscillator control signal generator comprising a comparator having a positive comparator input node coupled to the negative voltage supply node, a negative comparator input node connected to a reference voltage source that provides a reference voltage, and a comparator output node connected to the oscillator.

Clause 9. The circuit according to Clause 8, the oscillator control signal generator further comprising a level shifter connected between the negative voltage supply node and the positive comparator input node, the level shifter being configured to output a shifted voltage that depends on the negative voltage on the negative voltage supply node.

Clause 10. The circuit according to Clause 9, wherein when the shifted voltage is higher than the reference voltage, the comparator increases the frequency of the signal generated by the oscillator, and the negative voltage generation circuit decreases the negative voltage.

Clause 11. The circuit according to Clause 9, wherein when the shifted voltage is higher than the reference voltage, the comparator causes the frequency of the signal generated by the oscillator to be higher than when the shifted voltage is lower than the reference voltage.

Clause 12. The circuit according to Clause 10, wherein increasing the frequency of the signal generated by the oscillator causes the operating frequency of the negative voltage generation circuit to also increase, and decreasing the frequency of the signal generated by the oscillator causes the operating frequency of the negative voltage generation circuit to also decrease.

Clause 13. The circuit according to Clause 12, wherein the comparator is a multi-level comparator that causes the frequency of the signal generated by the oscillator to function at three or more different frequency levels.

Clause 14. The circuit according to Clause 2, wherein the negative voltage supply node is coupled to a gate terminal of a field-effect transistor.

Clause 15. The circuit according to Clause 2, the oscillator control signal generator comprising an operational amplifier having an operational amplifier positive input node coupled to the negative voltage supply node, an operational amplifier negative input node connected to a reference voltage source that provides a reference voltage source, and an operational amplifier output node connected to the oscillator.

Clause 16. The circuit according to Clause 15, the oscillator control signal generator further comprising a level shifter connected between the negative voltage supply node and the operational amplifier positive input node, the level shifter being configured to output a shifted voltage that depends on the negative voltage on the negative voltage supply node.

Clause 17. The circuit according to Clause 16, wherein when the shifted voltage is higher than the reference voltage, the operational amplifier increases the frequency of the signal generator by the oscillator, and the negative voltage generation circuit decreases the negative voltage.

Clause 18. The circuit according to Clause 16, wherein when the shifted voltage is higher than the reference voltage, the operational amplifier causes the frequency of the signal generated by the oscillator to be higher than when the shifted voltage is lower than the reference voltage.

Clause 19. The circuit according to Clause 18, wherein increasing the frequency of the signal generated by the oscillator causes the operating frequency of the negative voltage generation circuit to also increase, and decreasing the frequency of the signal generated by the oscillator causes the operating frequency of the negative voltage generation circuit to also decrease.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed:

1. A circuit configured to generate a negative voltage on a negative voltage supply node, the circuit comprising:
    an oscillator;
    a negative voltage generation circuit configured to respond to receiving a signal received from the oscillator by generating a negative voltage on the negative voltage supply node, wherein the negative voltage generation circuit operates at an operating frequency that depends at least on the frequency of the signal generated by the oscillator negative voltage is a function of a frequency of the signal received from the oscillator; and
    an oscillator control signal generator configured to sense the negative voltage present on the negative voltage supply node, and in response to the sensing, control the frequency of the signal generated by the oscillator to thereby control the operating frequency of the negative voltage generator, the oscillator control signal generator comprising:
        a comparator comprising:
            a positive input node;
            a negative comparator input node connected to a reference voltage source that provides a positive reference voltage, and
            an output node connected to the oscillator; and
        a level shifter connected between the negative voltage supply node and the positive input node of the comparator, the level shifter being configured to output a shifted voltage that is a positive voltage and a constant voltage above the negative voltage on the negative voltage supply node.

2. The circuit according to claim 1, the negative voltage generation circuit comprising a charge pump, the charge pump comprising:
    a charging capacitor having a first capacitor terminal and a second capacitor terminal;
    a first switch connected between a first input voltage source and the first capacitor terminal;
    a second switch connected between a second input voltage source and the second capacitor terminal;
    a third switch connected between the first capacitor terminal and a third input voltage source; and
    a fourth switch connected between the second capacitor terminal and the negative voltage supply node.

3. The circuit according to claim 2, wherein the first input voltage source provides a positive voltage, the second input voltage source provides ground, and the third input voltage source provides ground.

4. The circuit according to claim 2, wherein
    during a first phase of a charge pump cycle, the first switch and the second switch are closed while the third switch and the fourth switch are open, thereby providing charge to the charging capacitor, and
    during a second phase of the charge pump cycle, the third switch and the fourth switch are closed while the first switch and the second switch are open, thereby providing charge from the charging capacitor to the negative voltage supply node.

5. The circuit according to claim 4, the circuit further comprising a non-overlap component configured to prevent the first switch and the second switch from being closed while the third switch and the fourth switch are closed, and configured to prevent the third switch and the fourth switch from being closed while the first switch and the second switch are closed.

6. The circuit according to claim 4, wherein charge on the negative voltage supply node is stored on an external capacitor.

7. The circuit according to claim 1, wherein
    when the shifted voltage is higher than the positive reference voltage, the comparator causes the frequency of the signal generated by the oscillator to be higher than when the shifted voltage is lower than the positive reference voltage.

8. The circuit according to claim 1, wherein
    the positive reference voltage provided by the reference voltage source is a programmable voltage.

9. The circuit according to claim 1, wherein
    the positive reference voltage provided by the reference voltage source changes dynamically.

10. The circuit according to claim 1, wherein
    when the shifted voltage is higher than the positive reference voltage, the comparator increases the frequency of the signal generated by the oscillator, and the negative voltage generation circuit decreases the negative voltage.

11. The circuit according to claim 1, wherein the negative voltage supply node is coupled to a gate terminal of a field-effect transistor via a gate driver that is configured to provide a control voltage to the gate terminal of the field-effect transistor.

12. A circuit configured to generate a negative voltage on a negative voltage supply node, the circuit comprising:
an oscillator;
a negative voltage generation circuit configured to respond to receiving a signal received from the oscillator by generating a negative voltage on the negative voltage supply node, wherein the negative voltage is a function of a frequency of the signal received from the oscillator; and
an oscillator control signal generator configured to sense the negative voltage present on the negative voltage supply node, and in response to the sensing, control the frequency of the signal generated by the oscillator, the oscillator control signal generator comprising:
a multi-level digital comparator configured to cause the oscillator to operate at three or more discrete frequency levels such that
when the negative voltage on the negative voltage supply node is in a first range, the multi-level comparator outputs a first signal that causes the oscillator to oscillate at a first frequency;
when the negative voltage is in a second range that does not overlap with the first range, the multi-level comparator outputs a second signal that causes the oscillator to oscillate at a second frequency that is different than the first frequency, and
when the negative voltage is in a third range that does not overlap with both the first range and the second range, the multi-level comparator outputs a third signal that causes the oscillator to oscillate at a third frequency that is different than both the first frequency and the second frequency.

13. The circuit according to claim 12, the negative voltage generation circuit comprising a charge pump, the charge pump comprising:
a charging capacitor having a first capacitor terminal and a second capacitor terminal;
a first switch connected between a first input voltage source and the first capacitor terminal;
a second switch connected between a second input voltage source and the second capacitor terminal;
a third switch connected between the first capacitor terminal and a third input voltage source; and
a fourth switch connected between the second capacitor terminal and the negative voltage supply node.

14. The circuit according to claim 13, wherein the first input voltage source provides a positive voltage, the second input voltage source provides ground, and the third input voltage source provides ground.

15. The circuit according to claim 13, wherein
during a first phase of a charge pump cycle, the first switch and the second switch are closed while the third switch and the fourth switch are open, thereby providing charge to the charging capacitor, and
during a second phase of the charge pump cycle, the third switch and the fourth switch are closed while the first switch and the second switch are open, thereby providing charge from the charging capacitor to the negative voltage supply node.

16. The circuit according to claim 15, the circuit further comprising a non-overlap component configured to prevent the first switch and the second switch from being closed while the third switch and the fourth switch are closed, and configured to prevent the third switch and the fourth switch from being closed while the first switch and the second switch are closed.

17. The circuit according to claim 16, wherein charge on the negative voltage supply node is stored on an external capacitor.

* * * * *